(12) United States Patent  (10) Patent No.: US 7,430,141 B2
Bonelli  (45) Date of Patent: Sep. 30, 2008

(54) METHOD AND APPARATUS FOR MEMORY DATA DESKEWING

(75) Inventor: Andrea Bonelli, Les Hauts de Vaugrenier (FR)

(73) Assignee: Texas Instruments Incorporated, Dallas, TX (US)

( * ) Notice: Subject to any disclaimer, the term of this patent is extended or adjusted under 35 U.S.C. 154(b) by 127 days.

(21) Appl. No.: 10/991,010

(22) Filed: Nov. 16, 2004

(65) Prior Publication Data

US 2005/0141294 A1 Jun. 30, 2005

(51) Int. Cl.
*G11C 7/00* (2006.01)

(52) U.S. Cl. .................... 365/193; 365/194; 365/233.1; 365/233.5

(58) Field of Classification Search .............. 365/193, 365/194, 233, 233.5, 233.1
See application file for complete search history.

(56) References Cited

U.S. PATENT DOCUMENTS

| 6,407,963 | B1 * | 6/2002 | Sonoda et al. | 365/233.5 |
| 6,707,723 | B2 * | 3/2004 | Jeong | 365/189.05 |
| 6,947,334 | B2 * | 9/2005 | Shin | 365/189.01 |

\* cited by examiner

*Primary Examiner*—Hoai V Ho
(74) *Attorney, Agent, or Firm*—Ronald O. Neerings; Wade James Brady, III; Frederick J. Telecky, Jr.

(57) ABSTRACT

A memory interface (20) for receiving memory signals individually synchronizes data signals to a delayed strobe signal in order to reduce the spread of the data signals prior to sampling. A delay is increased for an individual data signal if it transitions prior to the delayed strobe signal and the delay is decreased if the data signal transitions after the delayed strobe signal.

22 Claims, 5 Drawing Sheets

US 7,430,141 B2

METHOD AND APPARATUS FOR MEMORY DATA DESKEWING

CROSS-REFERENCE TO RELATED APPLICATIONS

Not Applicable

STATEMENT OF FEDERALLY SPONSORED RESEARCH OR DEVELOPMENT

Not Applicable

BACKGROUND OF THE INVENTION

1. Technical Field

This invention relates in general to semiconductor memories and, more particularly, to a method and apparatus for deskewing data signals from a semiconductor memory.

2. Description of the Related Art

DDR (dual data rate) memory was developed to increase the bandwidth of data transfers to and from a memory. DDR memory differs from SDR (single data rate) memory by transferring data at both the rising edge and the falling edge of a strobe signal. Accordingly, twice as much data may be transferred in a given time period.

The timing margins to capture the data transmitted from the memory to an accessing device (and from the accessing device to the DDR memory) can be seriously affected by an accumulation of different static and dynamic parasitic effects from source to destination points. The effects include:

transistor mismatches at the output of the transmitting device;
length mismatches between bonding wires at the transmitting device;
different lengths of the paths on the printed circuit board;
length mismatches between bonding wires at the receiving device; and
transistor mismatches at the output of the receiving device.

Accordingly, the each bit of a received data word is likely to become stable at a slightly different time.

FIG. 1 is a timing diagram that illustrates the problem and the prior art resolution of the problem. A data word (DATA [7:0]) is received by an accessing device, and each data bit becomes stable within a time spread 10. The strobe signal transitions within the time spread 10. Hence, it may be possible that upon the transition of the strobe signal, some or all of the data bits have not become stable. To prevent errors due to unstable bit signals, a current solution adds a delay locked loop in the receiving device to generate a delayed strobe that is in an optimal timing window for data capture.

Nonetheless, the spread of data signals reduces the setup and hold margins. As the frequency of the memory accesses increases, the delayed strobe signal may be insufficient to ensure error-free operation.

Therefore, a need has arisen for a method and apparatus for accurately receiving multi-bit data from a memory at high speeds.

BRIEF SUMMARY OF THE INVENTION

A memory interface comprises circuitry for receiving a plurality of data signals and a strobe signal. A first delayed strobe signal and a second delayed strobe signal are generated from the strobe signal. Each of the plurality of data signals is individually delayed to synchronize the delayed data signals to the first delayed strobe signal. Data on the delayed data signals is captured responsive to the second delayed strobe signal.

The present invention provides significant advantages over the prior art. The data rate of a memory can be increased and/or reliability improved, because of the reduced spread of data signals caused by parasitic effects at the receiver. Further, requirements regarding board traces, package and device matching can be relaxed.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention is best understood in relation to FIGS. 2-10 of the drawings, like numerals being used for like elements of the various drawings.

Figure 2:
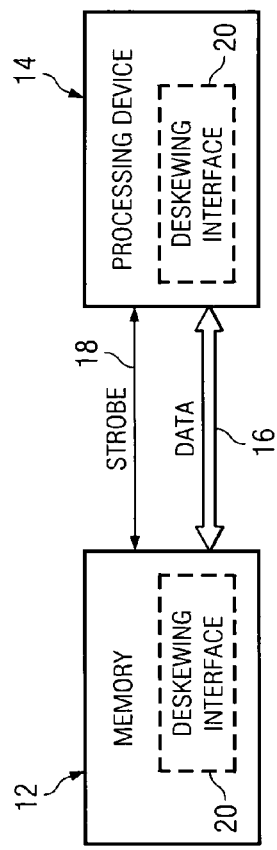
FIG. 2 illustrates a block diagram of a system with memory coupled to device.

FIG. 2 illustrates a block diagram of a system with memory 12 coupled to device 14 via a data bus 16 and strobe signal 18 (other control signals are not shown). Each device includes a deskewing interface 20 which aligns each of the received data signals to the strobe signal. Accordingly, the spread of the data signals is reduced, allowing accurate reading at higher data frequencies.

Figure 3:
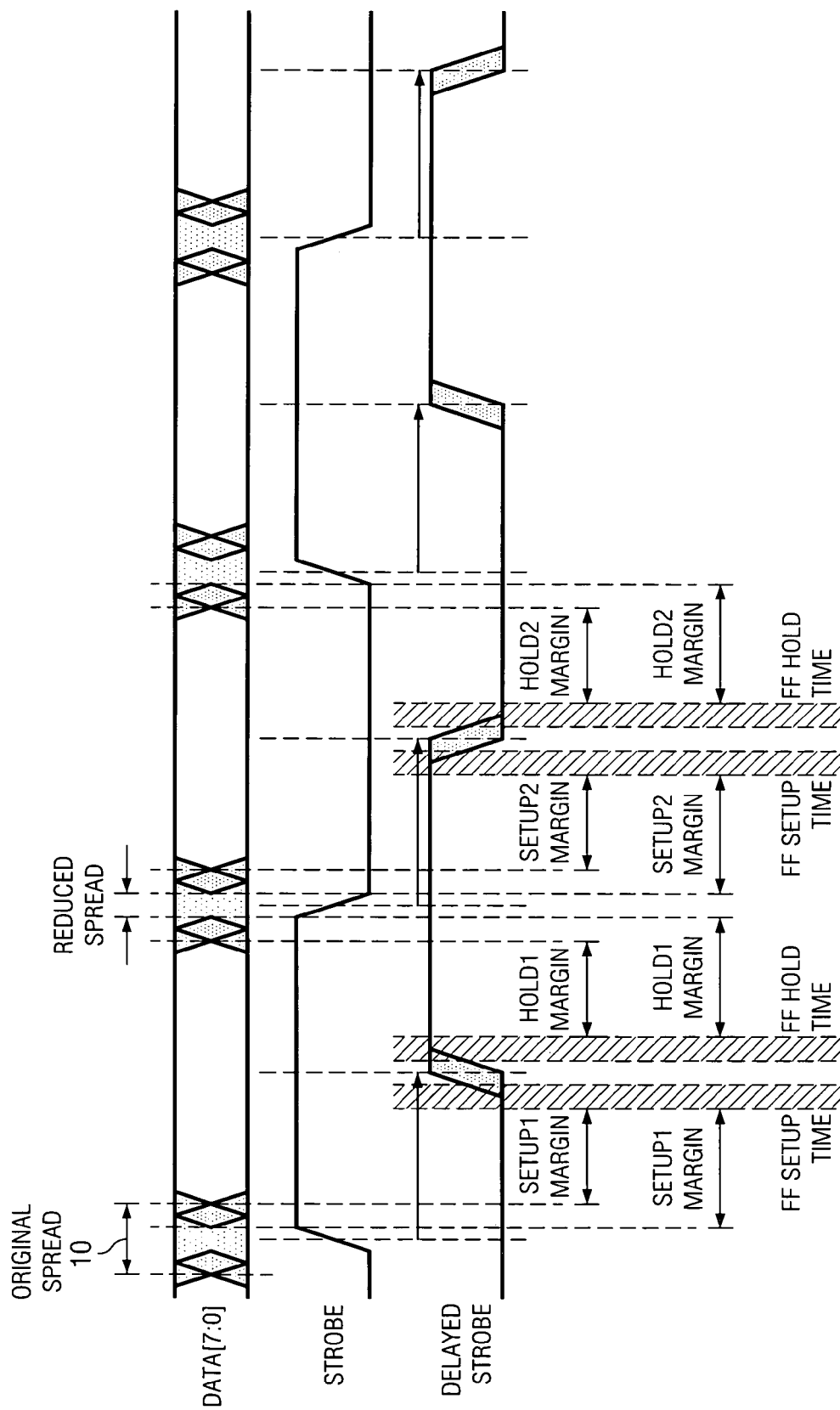
FIG. 3 is a timing diagram that graphically illustrates the improvement in setup and hold margins in relation to a reduced data spread.

FIG. 3 is a timing diagram that graphically illustrates the improvement in setup and hold margins in relation to a reduced data spread. The setup margin is the time difference between the point in time at which all data lines have valid data and the point at which the flip-flops sample the data (taking into account the setup time of the flip flop). The hold margin is the time difference between the point in time at which the flip-flops stored the data (taking into account the hold times for the flip-flops) and the earliest time at which any bit of the next data word may appear on the data bus 16. As can be seen in FIG. 3, as the spread becomes smaller, the setup margin increases, because the data on all incoming data lines is valid at an earlier time. Similarly, the hold margin increases, because the earliest arrival of a data bit of the following data word occurs at a later time. Accordingly, the increased margins can support a higher strobe frequency and/or can provide increased reliability.

Figure 1:
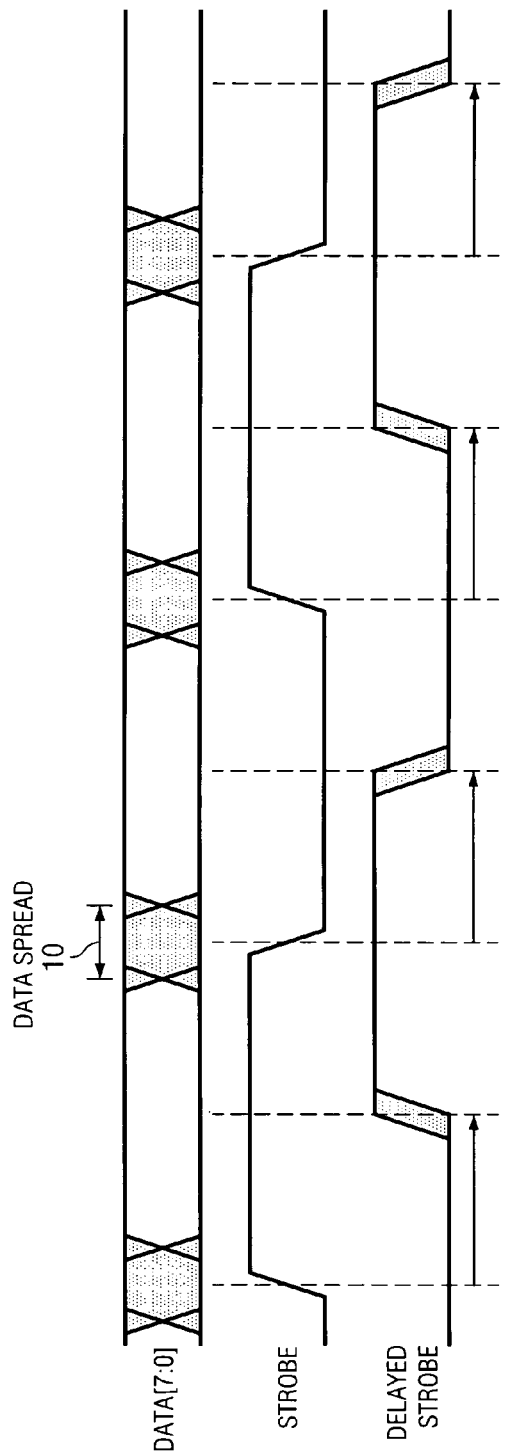
FIG. 1 illustrates a timing diagram showing a problem with current data memory interfaces.
Figure 4:
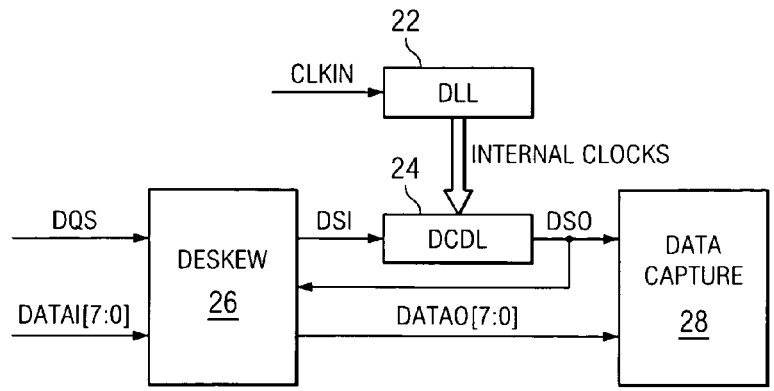
FIG. 4 illustrates a block diagram of a deskewing interface for reducing data spread.

FIG. 4 illustrates a block diagram of a deskewing interface 20. A reference clock signal CLKIN is received by a DLL (delay locked loop) 22. The DLL generates precisely synchronized internal clock synchronized to CLKIN. The DLL 22 produces a memory clock used for memory accesses. This clock is coupled to DCDL (digitally controlled delay line) 24. The strobe signal DQS and data signals DATAI[7:0] are coupled to deskew circuit 26. Deskew circuit outputs a slightly delayed strobe signal DSI and delayed data signals DATAO[0:7]. DCDL 24 delays the DSI by a predetermined fractional portion of the memory clock to produce the DSO signal. The DSO signal is used to capture the data signals (i.e., it is equivalent to the delayed strobe signal of FIGS. 1 and 3). DSO and DATAO[0:7] are coupled to data capture circuit 28, where flip-flops sample the DATAO signals responsive to DSO.

Figure 5:
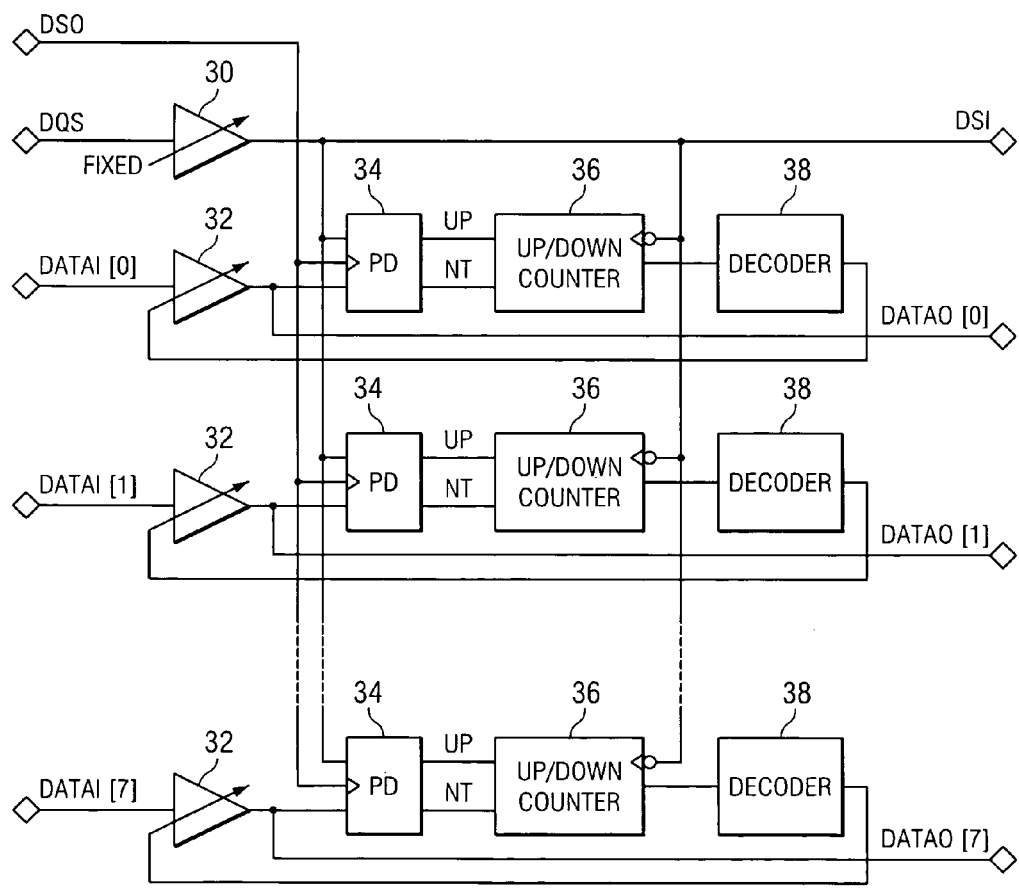
FIG. 5 illustrates a deskew circuit used in the deskewing interface of FIG. 4.

The deskew circuit 26 is shown in FIG. 5. DQS is coupled to a fixed delay element 30. The output of fixed delay element 30 is the DSI signal. The DSI signal should be delayed sufficiently so that it transitions after all signals on DATAI[0:7] have become stable.

Each of the eight data inputs, DATAI[0:7] are input to a respective variable delay element 32. The output of each variable delay element 32 is coupled to a phase detector 34, along with the DSO and DSI signals. Each phase detector 34 outputs two signals: an NT signal which indicates whether the associated data signal has transitioned, and an UP signal which indicates whether the associated data signal transitioned before or after the DSI signal. The UP and NT signal for each phase detector 34 are passed to a respective up/down counter 36, which is clocked by a falling edge of DSI. The output of the up/down counter 36 is coupled to a respective decoder 38. The output of the decoder controls the delay of the variable delay element 32. The output of the variable delay element 32 is a DATAO signal, which is passed to the data capture circuit 28.

In operation, the phase detector circuit, described in greater detail in connection with FIG. 6, determines whether a data transition has occurred and, if so, whether the transition occurred before or after transition of the DSI signal. The up/down counter 36 counts up or down based on the NT and UP signals from the associated phase detector 34 and the decoder converts the value stored in the counter 36 into a form which can be used to control the variable delay element 32.

Each counter 36 will count upwards until a delay is reached where it produces a delay in the variable delay element 32 at which DATAO[x] transitions after DSI. After this point, the value of the counter will remain relatively stable and the DATAO[x] will be precisely synchronized to DSI.

Accordingly, each delayed data input DATAO[0:7] will be individually synchronized to DSI according to any parasitic effects between the transmitting device and the receiving device. The spread between the individual DATAO[0:7] bits will be very small relative to the spread between the DATAI [0:7] bits. DSO is set to sample the DATAO[0:7] signals at a midpoint between transitions to optimize the setup and hold margins.

Figure 6:
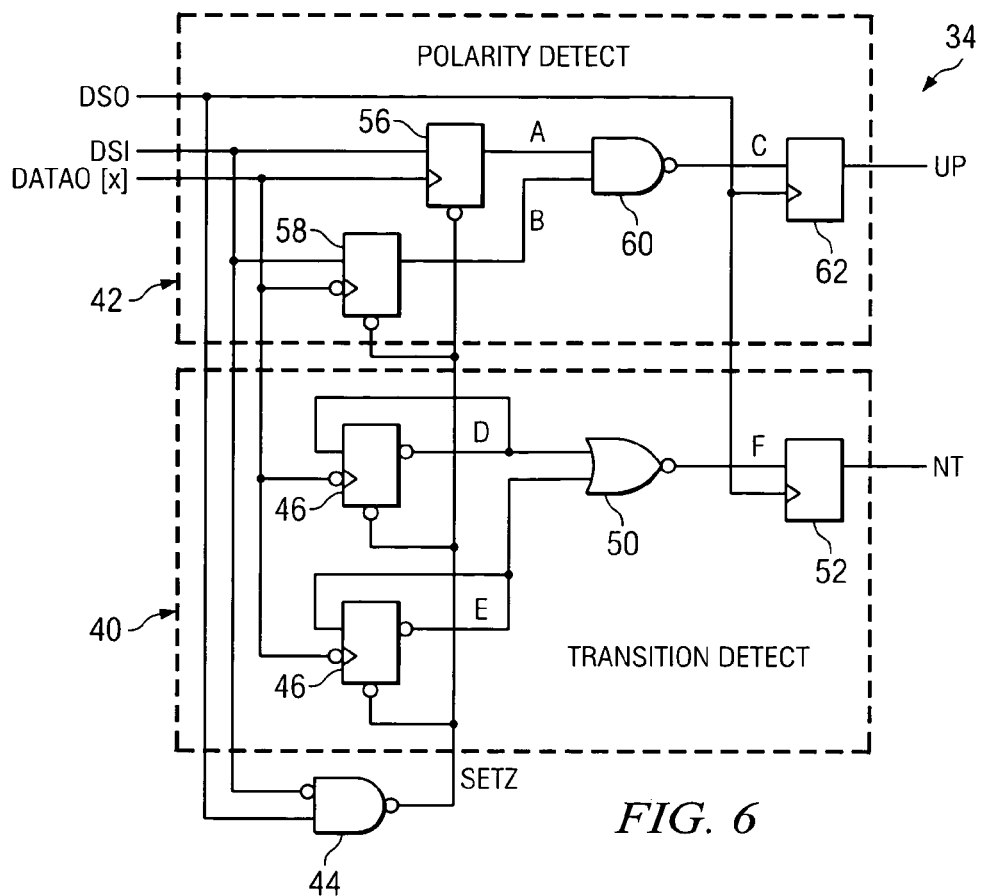
FIG. 6 illustrates a schematic representation of a phase detector used in the deskew circuit of FIG. 5.

FIG. 6 illustrates a schematic representation of the phase detector 34 for one data bit DATAO[x]. The phase detector circuit 34 includes a transition detect circuit 40, a polarity detect circuit 42, and a reset 44. Reset 44 is a NAND gate having DSO as one input and an inverted DSI as the second input. When DSO=1 and DSI=0 (which occurs when there are no current strobe signals), the output of the NAND gate (SETZ) is set to zero, which is used to reset the transition detect circuit 40 and the polarity detect circuit 42 to a known state.

The transition detect circuitry includes two latches 46 and 48. Latch 46 is clocked by a rising edge of DATAO[x] signal and latch 48 is clocked by a falling edge of the DATAO[x] signal. The input of each latch is coupled to its inverted output (D, E). The inverted outputs of each latch are coupled to the inputs of NOR gate 50. The output of NOR gate 50 (F) is coupled to the input of latch 52. Latch 52 is clocked by DSO. The output of latch 52 is the NT signal.

In operation, when SETZ=0, latches 46 and 48 are reset to "1" and hence the inverted outputs D and E are set to "0". A rising edge of DATAO[x] will cause latch 46 to store a "0" (hence D=1) or a falling edge of DATAO[x] will cause latch 48 to store a "0" (hence E=1). If the DATAO[x] does not transition (i.e., a "1" is followed by a "1" or a "0" is followed by a "0"), then neither latch will be clocked (both latches will store a "1"). NT will thus equal "0" only if one of the latches 46 or 48 is clocked.

The polarity detect circuitry 42 includes two latches 56 and 58. Latch 56 is clocked by a rising edge of DATAO[x] signal and latch 58 is clocked by a falling edge of the DATAO[x] signal. The input of each latch is coupled to DSI. The outputs of each latch (A and B) are coupled to the inputs of NAND gate 60. The output of NAND gate 60 (C) is coupled to the input of latch 62. Latch 62 is clocked by DSO. The output of latch 52 is the UP signal.

In operation, the polarity detect circuit 42 determines whether a rising edge of DATAO[x] occurs before a rising edge of DSI (only data transitions relative to rising edges of DSI are tracked). When SETZ=0, latches 56 and 58 are reset to "1" and hence outputs A and B are each set to "1" and C is set to "0". If a rising edge of DATAO[x] occurs prior to a rising edge of DSI, A will be set to "0" (since DSI will not have transitioned to a "1" by this point) and C will be set to "1". If a rising edge of DATAO[x] occurs after a rising edge of DSI, A will be set to "1" (since DSI will have transitioned to a "1" by this point) and C will remain at zero.

Similarly, if a falling edge of DATAO[x] occurs prior to a rising edge of DSI, B will be set to "0" (since DSI will not have transitioned to a "1" by this point) and C will be set to "1". If a falling edge of DATAO[x] occurs after a rising edge of DSI, B will be set to "1" (since DSI will have transitioned to a "1" by this point) and C will remain at zero.

Accordingly, each time a data transition of DATAO[x] occurs before a rising edge of DSI, NT=0 and UP=1, and the up/down counter will be incremented on the next falling edge of DSI. Each time a data transition of DATAO[x] occurs after a rising edge of DSI, NT=0 and UP=0, and the up/down counter will be decremented on the next falling edge of DSI. If a data transition does not occur during a DSI clock cycle, NT=1 and the clock is neither incremented nor decremented.

Figure 7:
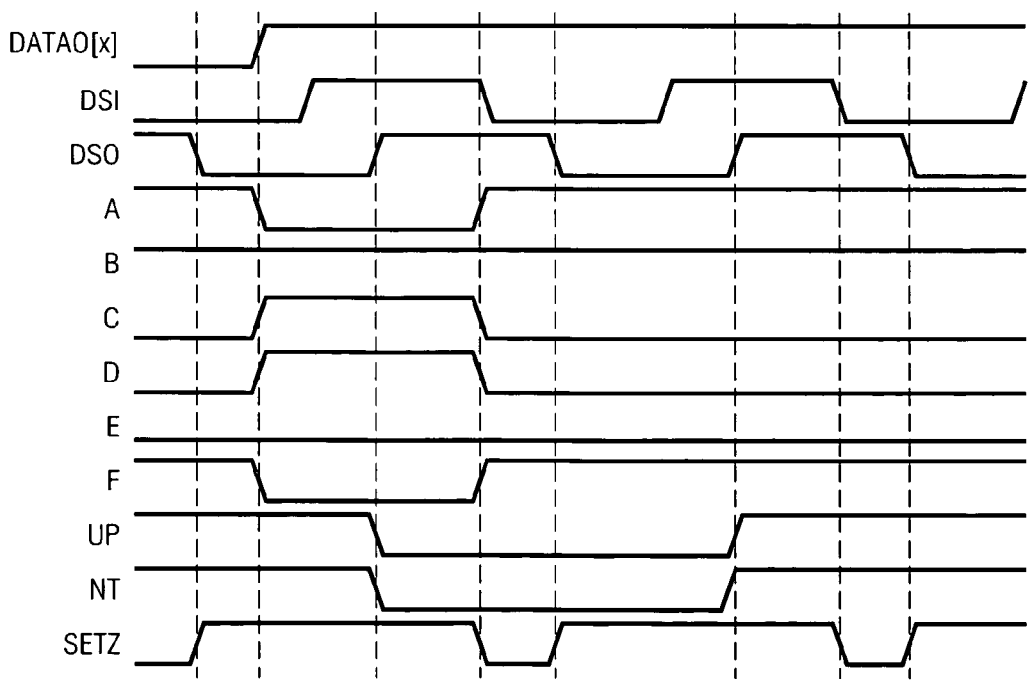
FIG. 7 illustrates a timing diagram for the circuit of FIG. 5 for a data signal that transitions prior to a rising edge of DSI.
Figure 8:
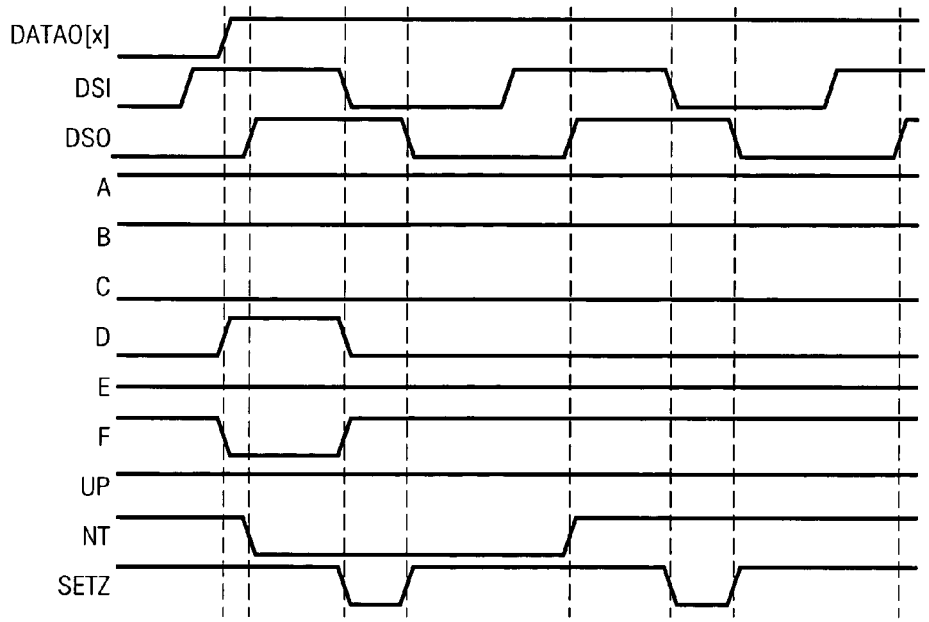
FIG. 8 illustrates a timing diagram for the circuit of FIG. 5 for a data signal that transitions after a rising edge of DSI.

FIG. 7 illustrates a timing diagram for the circuit of FIG. 5 for a data signal that transitions prior to a rising edge of DSI and FIG. 8 illustrates a timing diagram for the circuit of FIG. 5 for a data signal that transitions after a rising edge of DSI.

Figure 9:
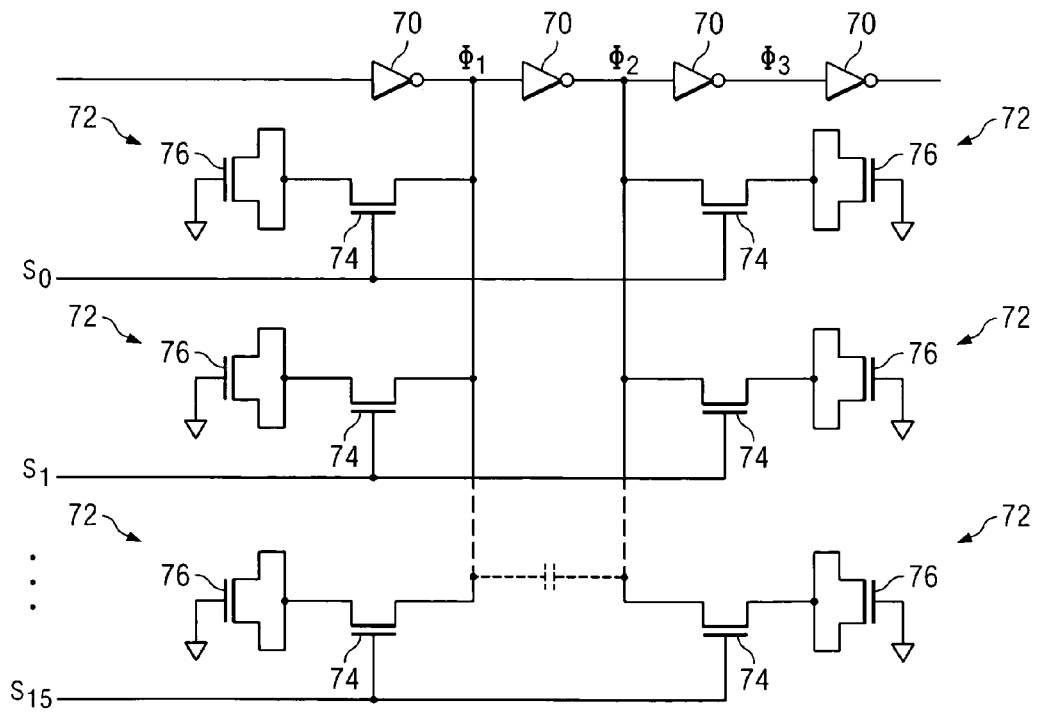
FIG. 9 illustrates a schematic representation of a circuit that could be used for the variable delay circuits of FIG. 5.

FIG. 9 illustrates a schematic representation of a circuit that could be used for the variable delay circuits 32. A string of four inverters 70 (an even number of inverters is used to prevent inversion of the signal). The inputs of the second and third inverters in the string are coupled to fifteen selectable capacitive load elements 72. Each load element is controlled by an output of decoder 38. The delay through the string of inverters 70 will vary upon the number of loads selected—the delay increases with an increase in the number of selected loads 72. In the illustrated embodiment, loads 72 are implemented using a first n-channel transistor 74 having a gate coupled to an output of the decoder and one source/drain coupled to the input of the inverter. The second source/drain is coupled both source/drains of n-channel transistor 76, which has a gate coupled to ground. The load 72 will be active if the gate of transistor 74 driven high and inactive if the gate of transistor 74 is grounded.

Figure 10:
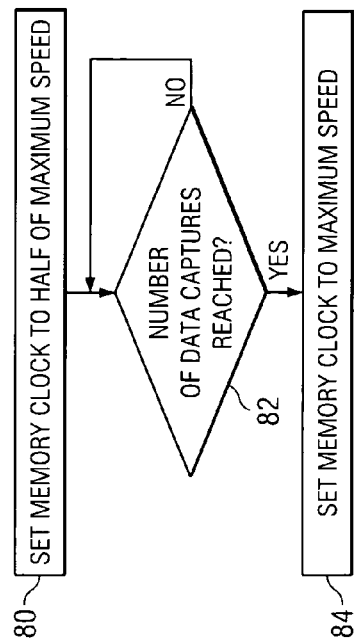
FIG. 10 illustrates a flow chart for calibrating the deskewing interface.

FIG. 10 illustrates a flow chart for calibrating the deskewing interface 20. In step 80, the DLL 22 is set to generate a memory clock at half of its desired frequency. This will prevent data errors from occurring prior to the data signals being synchronized with DSI. After a predetermined number of data captures to allow synchronization in step 82 (the number will depend upon the bits of the controlled delay element and the transition rate on the data bus), the DLL 22 generates a memory clock at its desired maximum frequency in step 84.

After the maximum data frequency is attained, the deskewing interface 20 can fix the delay elements 34 (since the parasitic delays will be mostly static), or allow the deskew circuit 26 to continue of change the delay of each data line to account for slow dynamic parasitic effects, such as temperature change.

The present invention provides significant advantages over the prior art. The data rate of a memory can be increased and/or reliability improved, because of the reduced spread of data signals caused by parasitic effects. Further, requirements regarding board traces, package and device matching can be relaxed.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the Claims.

The invention claimed is:

1. A memory interface comprising:
   circuitry for receiving a plurality of data signals and a strobe signal;
   circuitry for generating a first delayed strobe signal and a second delayed strobe signal from the strobe signal;
   circuitry for individually delaying each of the plurality of data signals to synchronize the delayed data signals to the first delayed strobe signal; and
   circuitry for capturing data on the delayed data signals responsive to the second delayed strobe signal.

2. The memory interface of claim 1 wherein said circuitry for individually delay each of the plurality of data signals comprises a delay stage for each data signal, each delay stage comprising:
   a variable delay element for delaying the data signal;
   a phase detector for detecting a difference between a transition of the first delayed strobe signal and the delayed data signal;
   circuitry for adjusting the variable delay element responsive to the difference.

3. The memory interface of claim 2 wherein the phase detector comprises:
   circuitry for detecting a transition in the delayed data signal;
   circuitry for determining whether a transition in the delayed data signal preceded a transition in the first delayed strobe signal.

4. The memory interface of claim 3 wherein the adjusting circuitry comprises circuitry for:
   increasing the delay through the variable delay element if the transition delayed data signal transitions preceded a transition in the first delayed strobe cycle;
   decreasing the delay through the variable delay element if the transition in delayed data signal occurred after a transition in the first delayed strobe cycle;
   maintaining the delay through the variable delay element if the delayed data signal did not transition.

5. A memory interface comprising:
   circuitry for receiving a plurality of data signals and a strobe signal;
   circuitry for generating a first delayed strobe signal and a second delayed strobe signal from the strobe signal;
   circuitry for individually delaying each of the plurality of data signals to synchronize the delayed data signals to the first delayed strobe signal, comprising a delay stage for each data signal, each delay stage comprising:
      a variable delay element for delaying the data signal;
      a phase detector for detecting a difference between a transition of the first delayed strobe signal and the delayed data signal, comprising:
         circuitry for detecting a transition in the delayed data signal;
         circuitry for determining whether a transition in the delayed data signal preceded a transition in the first delayed strobe signal;
      circuitry for adjusting the variable delay element responsive to the difference, comprising:
         a counter for counting responsive to information from the phase detector regarding whether a transition was detected in the delayed data signal and whether the transition in the delayed data signal preceded a transition in the first delayed strobe signal; and
         a decoder for generating a control signal to the variable delay element responsive to a value stored in said counter; and
   circuitry for capturing data on the delayed data signals responsive to the second delayed strobe signal.

6. A method of communicating data between a memory and a device, comprising the steps of:
   receiving a plurality of data signals and a strobe signal;
   generating a first delayed strobe signal and a second delayed strobe signal from the strobe signal;
   individually delaying each of the plurality of data signals to synchronize the delayed data signals to the first delayed strobe signal; and
   capturing data on the delayed data signals responsive to the second delayed strobe signal.

7. The method of claim 6 wherein said step of individually delaying each of the plurality of data signals comprises, for each data signal, the steps of:
   setting a delay through a variable delay element for delaying the data signal;
   detecting a difference between a transition of the first delayed strobe signal and the delayed data signal;
   adjusting the delay through the variable delay element responsive to the difference.

8. The method of claim 7 wherein the detecting step comprises the steps of:
   detecting a transition in the delayed data signal;
   determining whether a transition in the delayed data signal preceded a transition in the first delayed strobe signal.

9. The method of claim 8 wherein the adjusting step comprises the steps of:
   increasing the delay through the variable delay element if the transition delayed data signal transitions preceded a transition in the first delayed strobe cycle;
   decreasing the delay through the variable delay element if the transition in delayed data signal occurred after a transition in the first delayed strobe cycle;

maintaining the delay through the variable delay element if the delayed data signal did not transition.

10. A method of communicating data between a memory and a device, comprising the steps of:
receiving a plurality of data signals and a strobe signal;
generating a first delayed strobe signal and a second delayed strobe signal from the strobe signal;
individually delaying each of the plurality of data signals to synchronize the delayed data signals to the first delayed strobe signal, comprising, for each data signal, the steps of:
setting a delay through a variable delay element for delaying the data signal;
detecting a difference between a transition of the first delayed strobe signal and the delayed data signal, comprising the steps of:
detecting a transition in the delayed data signal;
determining whether a transition in the delayed data signal preceded a transition in the first delayed strobe signal;
adjusting the delay through the variable delay element responsive to the difference, comprising the steps of:
counting in a counter responsive to information from the phase detector regarding whether a transition was detected in the delayed data signal and whether the transition in the delayed data signal preceded a transition in the first delayed strobe signal;
generating a control signal to the variable delay element responsive to a value stored in said counter; and
capturing data on the delayed data signals responsive to the second delayed strobe signal.

11. A memory interface comprising:
a circuit for receiving a plurality of data signals and a strobe signal;
circuitry for generating a first delayed strobe signal and a second delayed strobe signal from the strobe signal;
circuitry for individually delaying each of the plurality of data signals to synchronize the delayed data signals to the first delayed strobe signal; and
circuitry for capturing data on the delayed data signals responsive to the second delayed strobe signal.

12. The memory interlace of claim 11 wherein said circuitry for individually delay of each of the plurality of data signals comprises a delay stage for each data signal, each delay stage comprising:
a variable delay element for delaying the data signal;
a phase detector for detecting a difference between a transition of the first delayed strobe signal and the delayed data signal;
circuitry the adjusting the variable delay element responsive to the difference.

13. The memory interface of claim 12 wherein the phase detector comprises:
circuitry for detecting a transition in the delayed data signal;
circuitry for determining whether a transition in the delayed data signal preceded a transition in the first delayed strobe signal.

14. The memory interface of claim 13 wherein the adjusting circuitry comprises circuitry for:
increasing the delay through the variable delay element if the transition delayed data signal transitions preceded a transition in the first delayed strobe cycle;
decreasing the delay trough the variable delay element if the transition in delayed data signal occurred after a transition in the first delayed strobe cycle;

maintaining the delay through the variable delay element if the delayed data signal did not transition.

15. A memory interface comprising:
a circuit for receiving a plurality of data signals and a strobe signal;
circuitry for generating a first delayed strobe signal and a second delayed strobe signal from the strobe signal;
circuitry for individually delaying each of the plurality of data signals to synchronize the delayed data signals to the first delayed strobe signal, comprising a delay stage for each data signal, each delay stage comprising:
a variable delay element for delaying the data signal;
a phase detector for detecting a difference between a transition of the first delayed strobe signal and the delayed data signal, comprising:
circuitry for detecting a transition in the delayed data signal;
circuitry for determining whether a transition in the delayed data signal preceded a transition in the first delayed strobe signal;
circuitry for adjusting the variable delay element responsive to the difference, comprising:
a counter for counting responsive to information from the phase detector regarding whether a transition was detected in the delayed data signal and whether the transition in the delayed data signal preceded a transition in the first delayed strobe signal;
a decoder for generating a control signal to the variable delay element responsive to a value stored in said counter; and
circuitry for capturing data on the delayed data signals responsive to the second delayed strobe signal.

16. The memory interface of claim 11, wherein the circuit for receiving a plurality of data signals and a strobe signal comprises a deskew circuit.

17. A method of communicating data between a memory and a device, comprising the steps of:
receiving in a circuit a plurality of data signals and a strobe signal;
generating a first delayed strobe signal and a second delayed strobe signal from the strobe signal;
individually delaying each of the plurality of data signals to synchronize the delayed data signals to the first delayed strobe signal; and
capturing data on the delayed data signals responsive to the second delayed strobe signal.

18. The method of claim 17 wherein said step of individually delaying each of the plurality of data signals comprises, for each data signal, the steps of:
setting a delay through a variable delay element for delaying the data signal;
detecting a difference between a transition of the first delayed strobe signal and the delayed data signal;
adjusting the delay through the variable delay element responsive to the difference.

19. The method of claim 18 wherein the detecting step comprises the steps of:
detecting a transition in the delayed data signal;
determining whether a transition in the delayed data signal preceded a transition in the first delayed strobe signal.

20. The method of claim 19 wherein the adjusting step comprises the steps of:
increasing the delay through the variable delay element if the transition delayed data signal transitions preceded a transition in the first delayed strobe cycle;

decreasing the delay through the variable delay element if the transition in delayed data signal occurred after a transition in the first delayed strobe cycle;

maintaining the delay through the variable delay element if the delayed data signal did not transition.

21. A method of communicating data between a memory and a device, comprising the steps of:

receiving in a circuit a plurality of data signals and a strobe signal;

generating a first delayed strobe signal and a second delayed strobe signal from the strobe signal;

individually delaying each of the plurality of data signals to synchronize the delayed data signals to the first delayed strobe signal, comprising, for each data signal, the steps of:

setting a delay through a variable delay element for delaying the data signal;

detecting a difference between a transition of the first delayed strobe signal and the delayed data signal, comprising the steps of:

detecting a transition in the delayed data signal;

determining whether a transition in the delayed data signal preceded a transition in the first delayed strobe signal;

adjusting the delay through the variable delay element responsive to the difference, comprising the steps of:

counting in a counter responsive to information from the phase detector regarding whether a transition was detected in the delayed data signal and whether the transition in the delayed data signal preceded a transition in the first delayed strobe signal; and generating a control signal to the variable delay element responsive to a value stored in said counter; and capturing data on the delayed data signals responsive to the second delayed strobe signal.

22. The method of claim 17, wherein the circuit that receives a plurality of data signals and a strobe signal comprises a deskew circuit.

* * * * *